United States Patent
Buijsse et al.

(10) Patent No.: US 9,908,778 B2
(45) Date of Patent: Mar. 6, 2018

(54) METHOD OF PRODUCING A FREESTANDING THIN FILM OF NANO-CRYSTALLINE GRAPHITE

(71) Applicants: FEI Company, Hillsboro, OR (US); Max-Planck-Gesellschaft zur Förderung der Wissenschaften e.V, Munich (DE)

(72) Inventors: Bart Buijsse, Eindhoven (NL); Radostin Stoyanov Danev, Munich (DE); Kasim Sader, Doorwerth (NL)

(73) Assignees: FEI Company, Hillsboro, OR (US); Max-Planck-Gesellschaft zur Förderung der Wissenschaften e.V, Munich (DE)

(*) Notice: Subject to any disclaimer, the term of this patent is extended or adjusted under 35 U.S.C. 154(b) by 0 days.

(21) Appl. No.: 14/560,919

(22) Filed: Dec. 4, 2014

(65) Prior Publication Data
US 2015/0151972 A1 Jun. 4, 2015
US 2016/0096734 A2 Apr. 7, 2016

(30) Foreign Application Priority Data

Dec. 4, 2013 (EP) .................... 13195596

(51) Int. Cl.
*C01B 31/04* (2006.01)
*H01J 37/22* (2006.01)
(Continued)

(52) U.S. Cl.
CPC ............. *C01B 31/04* (2013.01); *H01J 37/20* (2013.01); *H01J 37/22* (2013.01); *H01J 37/26* (2013.01);
(Continued)

(58) Field of Classification Search
CPC . C01B 31/04; H01J 37/20; H01J 37/22; H01J 37/31; H01J 2237/3114; H01J 37/26; C23C 16/26
See application file for complete search history.

(56) References Cited

U.S. PATENT DOCUMENTS 7,915,584 B2   3/2011   Tiemeijer et al.
7,977,633 B2   7/2011   Barton et al.
(Continued)

FOREIGN PATENT DOCUMENTS

DE   102011014399 A1   9/2012
TW      201133546 A1   10/2011

OTHER PUBLICATIONS

Baek, Seung, et al. "Investigation of Mechanical Stability of Thermally Aged ac: H DLC Films with Different Precursor Gases." Key Engineering Materials. vol. 353. 2007.*

(Continued)

*Primary Examiner* — Richard M Rump
(74) *Attorney, Agent, or Firm* — Scheinberg & Associates, P.C.; Michael O. Scheinberg

(57) ABSTRACT

A freestanding thin film of nano-crystalline graphite is described, as well as a method of producing a freestanding thin film of nano-crystalline graphite including:
 providing a freestanding thin film of amorphous carbon,
 heating the freestanding thin film to a high temperature in an inert atmosphere or in a vacuum; and
 allowing the freestanding thin film to cool down,
as a result of which a freestanding thin film of nano-crystalline graphite is formed.
The films can be used, for example, as phase plates in a Transmission Electron Microscope.

21 Claims, 3 Drawing Sheets

(51) Int. Cl.
*H01J 37/31* (2006.01)
*H01J 37/20* (2006.01)
*H01J 37/26* (2006.01)

(52) U.S. Cl.
CPC ....... *H01J 37/31* (2013.01); *H01J 2237/3114* (2013.01)

(56) References Cited

U.S. PATENT DOCUMENTS

| | | |
|---|---|---|
| 8,071,954 B2 | 12/2011 | Wagner et al. |
| 8,633,456 B2 | 1/2014 | Buijsse et al. |
| 8,772,716 B2 | 7/2014 | Buijsse |
| 8,835,846 B2 | 9/2014 | Buijsse et al. |
| 9,129,774 B2 | 9/2015 | Buijsse et al. |
| 2013/0313428 A1 | 11/2013 | Buijsse |
| 2015/0136172 A1 | 5/2015 | Kurth et al. |

OTHER PUBLICATIONS

Wan, J. Z., Fred H. Pollak, and Benjamin F. Dorfman. "Micro-Raman study of diamondlike atomic-scale composite films modified by continuous wave laser annealing." Journal of applied physics 81.9 (1997): 6407-6414.*

Turchanin, Andrey, et al. "Conversion of self-assembled monolayers into nanocrystalline graphene: structure and electric transport." ACS nano 5.5 (2011): 3896-3904.*

Danev, R., R. Glaeser, and B. Buijsse. "Properties and Behavior of Amorphous Carbon Films Related to Phase Plate Applications." Microscopy and Microanalysis 18.S2 (2012): 482-483.*

Rhinow, Daniel, Nils-Eike Weber, and Andrey Turchanin. "Atmospheric pressure, temperature-induced conversion of organic monolayers into nanocrystalline graphene." The Journal of Physical Chemistry C 116.22 (2012): 12295-12303.*

Gaudin, J., et al. "Solid-to-solid phase transition from amorphous carbon to graphite nanocrystal induced by intense femtosecond x-ray pulses." arXiv preprint arXiv:1111.2134 (2011).*

Li, Xin-Hao et al., "Synthesis of Monolayer-Patched Graphene from Glucose," Angewandte Communications, (2012), pp. 9689-9692, vol. 51.

Turchanin, Andrey et al., "Conversion of Self-Assembled Monolayers into Nanocrystalline Graphene: Structure and Electric Transport," American Chemical Society, Nano, (2011), pp. 3896-3904, vol. 5 No. 5.

* cited by examiner

METHOD OF PRODUCING A FREESTANDING THIN FILM OF NANO-CRYSTALLINE GRAPHITE

The invention relates to a method of producing a freestanding thin film of nano-crystalline graphite.

Freestanding thin films of amorphous carbon are used in, for example, transmission electron microscopy (TEM) as material in a Zernike phase plate, as described in "Phase Contrast Enhancement with Phase Plates in Biological Electron Microscopy", K. Nagayama et al., Microscopy Today, Vol. 18 No. 4 (July 2010), pp. 10-13, further referred to as Nagayama [-1-]

In a Transmission Electron Microscope (TEM) a sample is imaged by passing a beam of energetic electrons with a selectable energy of, for example, between 40 keV and 400 keV, through the sample. For so-called weak-phase samples, such as biological samples, most electrons pass through the sample unhindered (unscattered) while some electrons are elastically or inelastically scattered, the elastically scattered electrons forming diffracted beams. The image is formed by interference of the elastically scattered and unscattered electrons (diffracted and undiffracted beams).

A problem arises in that the Contrast Transfer Function (CTF) for low spatial frequencies in the image is zero or close to zero, resulting in low visibility of large objects/structures. This is caused by the fact that a camera or fluorescent screen in the image plane is sensitive to intensity variations, but not to phase variations of the impinging electron beam.

A solution to this is the use of a phase plate in the diffraction plane (or a plane conjugate to it): the phase plate introduces a phase difference between the diffracted beams and the undiffracted beam. There are several types of phase plates, of which the Zernike phase plate is of particular interest for the invention. In a Zernike phase plate the phase of the undiffracted beam is left unchanged, and the phase of the diffracted beams is changed by passing these beams through a thin film of, for example, amorphous carbon. The thin film is preferably a homogeneous film. A crystal in the diffraction plane would cause Bragg reflections of the electron beam in discrete directions, resulting in a final image consisting of multiple overlapping images of the sample. Moreover, different crystal domains of micrometer size induce a different phase shift to the passing electrons, complicating or obstructing the image formation. Therefore an amorphous film is used, where no or very little crystals are present.

The introduction of the phase difference by the phase plate changes the sine-like behavior of the CTF to a cosine-like behavior, and thus a maximum contrast for low spatial frequencies. For a more thorough description of phase plates and other contrast enhancing devices see the earlier mentioned publication of K. Nagayama [-1-].

A disadvantage of the freestanding thin films of amorphous carbon is the change in the bulk or surface electronic structure of the film when irradiated by electrons. This is described in more detail in patent application EP13165356, and is here referred to as the Volta effect. The result is that a part of the film that is irradiated shows so-called "footprints" (areas where the beam deposited a relative large dose of electrons), and when used as material for a phase plate the beam of electrons passing through a "footprinted" part of the film experiences a phase shift that differs from the beam passing through other parts of the beam where no footprint is formed.

It is noted that footprints disappear in time, with a time constant in the order of hours to days. Therefore, although a Volta phase plate as described in EP13165356 can be used, it is not stable in time.

It is noted that freestanding thin films of amorphous carbon with a thickness of between 1 nm and 5 µm are commercially available from, for example, Arizona Carbon Foil Co., Inc, Tucson, Ariz., USA, and are described in http://www.emgrid.com.au/pdf/ACF-Metals-Products.pdf, created Aug. 14, 2007, more specifically paragraph 1, most specifically paragraph 1.1, and sold via, for example, Agar Scientific, Stansted, Essex, CM24 8GF, United Kingdom (http://www.agarscientific.com/ultra-smooth-carbon-foils.html).

When using a thin film of crystalline carbon and to avoid phase variations due to crystals the crystal size should preferably be smaller than the imaged source size at the diffraction plane. For state-of-the-art TEMs this imaged source size at the diffraction plane can be as small as 30 nm.

There is thus a desire to form phase plates from a carbon film with very small crystals, the crystal size much less than 100 nm, so-called nano-crystalline carbon (NCC).

The invention intends to provide a method for producing a freestanding thin film of nano-crystalline graphite (NCG).

To that end the method of the invention is characterized in that the method comprises the steps of:
providing a freestanding thin film of amorphous carbon,
locally heating the freestanding thin film to a high temperature in an inert atmosphere or in a vacuum; and
allowing the freestanding film to cool down,
as a result of which a freestanding thin film of nano-crystalline graphite is formed.

Inventors are of the opinion that the freestanding film is of a graphitic nature, i.e. is a freestanding film of nano-crystalline graphite (NCG). These films could thus also be referred to as "heat treated films". However, should the film be of nano-crystalline carbon, in further reference where reference to NCG is made, equal reference is made to nano-crystalline carbon (NCC).

It is noted that no carbon is added to the thin film, nor that ablation occurs, and that the invention solely relies on a phase change of the thin film.

It is further noted that such a thin film is supported by a carrier, for example in the form of a TEM grid. The person skilled in the art will recognize that the parts where the carrier is supported are not heated, or to a much lesser degree. Therefore "locally heated" should in this context be interpreted as not including the part of the film supported by the carrier structure, and even a much smaller area may be heated, depending on the use of the thin film of NCG.

Preferably the heating is done using a laser.

Using a laser, such as an infrared laser, a visible light laser, with a power of, for example 10-100 mW, proved when focused to an extended spot (so working out of focus) an easy way to heat the foil.

The wave length of the laser, the power of the laser, the size of the irradiated area and the thickness of the thin film should preferably be such that the free-standing thin film absorbs between 0.1 $MW/m^2$ and 20 $MW/m^2$, more preferably between 0.75 $MW/m^2$ and 12 $MW/m^2$.

Experiments showed that under these conditions the temperature of the freestanding thin film cause the formation of NCG. However, too high a power density (above approximately 20 $MW/m^2$) causes the carbon film to heat to a temperature where excessive evaporation occurs (approximately 3700 K), as a result of which holes are burned in the film in a few seconds or even less.

This implies that at a power density of approximately 20 MW/m² a temperature of approximately 3700 K is reached, and—assuming P≈T⁴—that 'normal' heating is between 1000 K (at 0.1 MW/m²) and 3700 K (at 20 MW/m²), more preferably between 1625 K (at 0.75 MW/m²) and 3250 K (at 12 MW/m²).

It is noted that the thin film is partly transparent as the film is so thin. The transparency also depends on the wavelength of the impinging (laser) light and therefore heating conditions are best expressed in an absorbed power instead of in a power impinging on the film.

The film is preferably heated for at least 1 second so that a fine control of the deposited energy in the foil can be achieved.

Preferably the thickness of the thin film is less than 1 μm, more specifically less than 250 nm, most specifically less than 50 nm.

For a phase plate the thickness of the film should ideally be 19.9 nm to cause a phase shift of λ/2 for 80 keV electrons, 27.6 nm to cause a phase shift of λ/2 for 200 keV electrons and 30.8 nm to cause a phase shift of λ/2 for 300 keV electrons. It is remarked that also thicknesses not too far removed from these ideal values give a marked improvement of the contract transfer for larger structures.

Thicker foils can be used, as a foil with for example a thickness three times thicker than mentioned causes a phase shift of 3·λ/2 and results in a CTF that in absolute value is identical. However, a thicker film also causes more scattering and thus loss of contrast.

When using the film for other purposes, for example as a carrier film in a sample carrier or as a gas-tight film in an environmental cell, the foil may have other preferred thicknesses, governed by, for example, the strength of the foil.

The freestanding thin film may be allowed to cool down in an environment of less than 500 K, more specifically at room temperature.

It is believed that to get NCG the foil should be quenched to a sufficiently low temperature. Experiments showed that allowing the foil to cool down in an environment at room temperature or even 500 K sufficed to reproducibly produce NCG foils.

Preferably the foil is allowed to cool to a temperature of below 1000 K in less than 1 ms, more specifically less than 0.25 ms.

It is likely that the time in which the thin film cools is of importance: rapid cooling will prohibit the growth of large crystal domains. Calculation show that the cooling down of a thin film is in the order of 0.1 ms for cooling from 2500K to 1250K, 0.2 ms for cooling down from 2500K to 1000K and 1.5 ms for cooling down from 2500K to 500K. This is assuming a film that is thick enough to be non-transparent to the thermal radiation. As this is not the case here these cooling times are expected to be "worst case" numbers.

The freestanding thin film may be supported by a TEM grid, more specifically a TEM grid comprising a metal or silicon.

Supporting the thin film with such a grid with an, in the electron microscope world, standardized size causes an easy interface with positioning rods etc.

The method may comprise the additional step of forming one or more holes in the film for passing a beam of undiffracted electrons, as a result of which a phase plate or a phase mask for a Transmission Electron Microscope (TEM) is formed.

Hereby a phase plate or phase mask is formed for use in a TEM, the hole or holes for passing the beams of undiffracted or diffracted electrons. The hole or holes can be formed by focused ion beam milling, or by focusing a laser beam on the film at such power density that a hole is burned, or by focusing an electron beam on the film in the presence of an etchant gas such as water vapour.

In an aspect of the invention a component for a Transmission Electron Microscope (TEM) is a component comprising or made of nano-crystalline graphite.

The component may be a component from the group of phase plates, phase masks, and sample carriers.

A component such as a phase plate, phase mask or a sample carrier (including TEM sample grids) formed from NCG may show better performance than a component of another material, as it combines the properties of carbon (for example low X-ray generation, low backscatter coefficient), without the drawbacks of microcrystalline graphite and without the drawbacks of amorphous carbon ("footprints"). The absence of footprints indicates the absence of local electric fields, and thus the absence of aberrations and deflections caused by these local electric fields.

It is remarked that phase masks are used, for example, to form a helical-shaped beam of electrons that could produce significantly higher-resolution images than is possible with conventional TEM, enabling the capture of images with increased signal-to-noise ratio of weak phase objects such as bacteria and proteins. More information about phase masks and helical-shaped beams of electrons ('vortex beams') is found in, for example, "Electron Vortex Beams with High Quanta of Orbital Angular Momentum", B. J. McMorran et al., Science 331, 192 (2011), pp. 192-195.

It is noted that the ability to form holes in nano-crystalline carbon leads to holes with little or no differences in contact potential around the border (the boundary) of the hole, leading to little or no deflection caused by said boundary.

A Transmission Electron Microscope may comprise a component comprising of or made from NCG.

BRIEF DESCRIPTION OF THE DRAWINGS

The invention is now elucidated using figures, in which identical reference numerals refer to corresponding features. To that end.

DETAILED DESCRIPTION OF SAMPLE EMBODIMENTS

Figure 1:
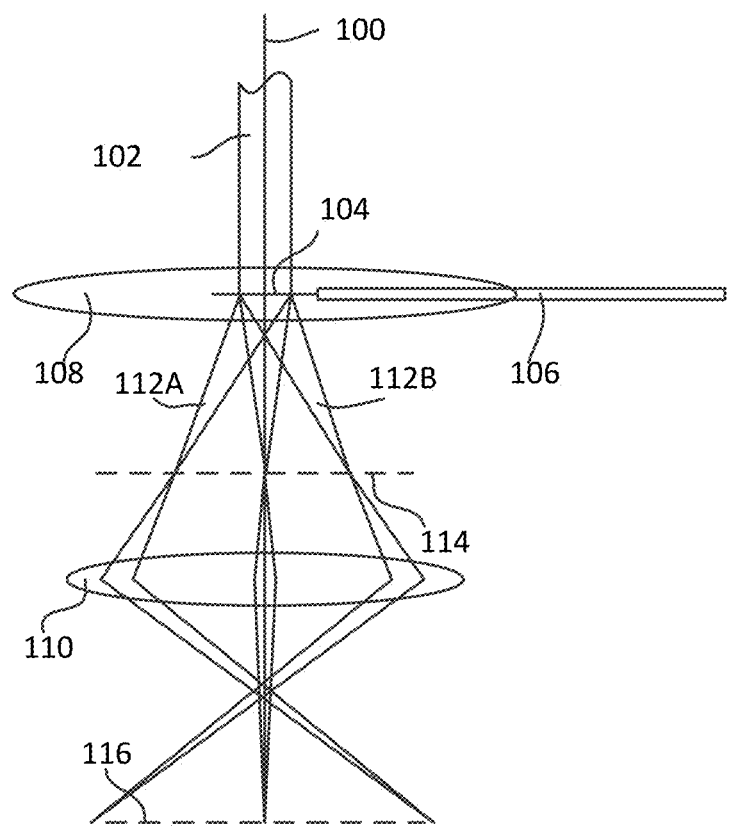
FIG. 1 schematically shows a part of a transmission electron microscope.

FIG. 1 schematically shows a part of a transmission electron microscope.

A parallel beam 102 of electrons with a selectable energy of, for example, between 40 and 400 keV, travelling along an optical axis 100. The beam of electrons is formed by an electron source (not shown) and turned in a parallel beam by condenser optics (not shown). The condenser optics can vary the diameter of the beam. The beam then impinges on the sample 104, that is positioned in the objective lens 108 by positioning unit 106. Due to the wave nature of electrons part of the electrons are scattered by the sample in beams 112A and 112B. These beams, and the central beam of unscattered electrons is focused in the diffraction plane 114. In the diffraction plane thus a Fourier representation of the sample is available. The diffraction plane is imaged by the diffraction lens 110, forming an enlarged image of the sample in image plane 116.

Figure 2:
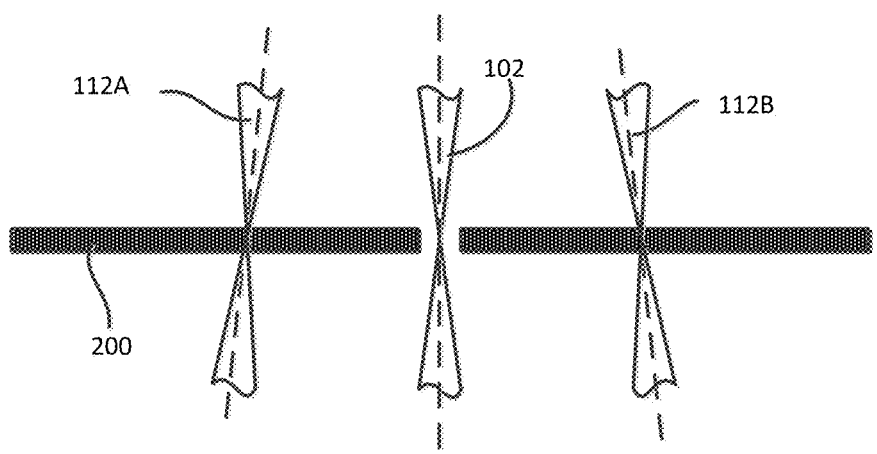
FIG. 2 schematically shows a Zernike phase plate.

FIG. 2 schematically shows a Zernike phase plate.

The Zernike phase plate consists of a thin film 200 of a material with a small hole. The diameter of the hole is typically 1 μm or less, and the material typically carbon. The wavelength of the electrons while passing through the carbon is shorter than when passing through vacuum. As a result the beams of electrons 112A and 112B, after passing through the carbon film, are phase shifted compared to the beam 102 passing through the hole. When now a beam of hardly scattered electrons (beam 112A and 112B close to the hole) are made to interfere in the image plane 116 with the beam of unscattered electrons 102, the contrast transfer function is high, opposed to the situation that would occur when the phase shift was not introduced: then the contrast transfer function would be zero, assuming there are no optical aberrations in the system.

It is noted that the phase plate is positioned in the diffraction plane on a high precision holder. Alternatively the phase plate is not placed in the diffraction plane, but in an image of that plane, preferably an enlarged image, thereby making it easier to position the phase plate.

Figure 3:
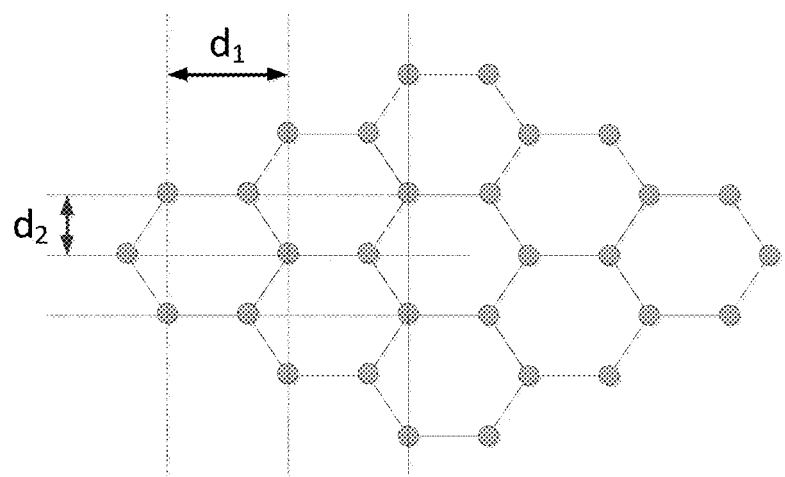
FIG. 3 schematically shows a layer of nano-crystalline graphite.

FIG. 3 schematically shows a layer of nano-crystalline graphite.

The lattice of NCG is built from hexagons of carbon atoms, the atoms here represented as dots. The atoms are in one plane (graphite has many planes stacked on top of each other). The most important lattice constants are $d_1$=0.213 nm and $d_2$=0.123 nm. The smaller distance of $d_1$ results in a smaller circle 402 in the diffraction pattern shown in FIGS. 4A and 4B, while the smaller distance of $d_2$ results in the larger circle 404 in the diffraction pattern shown in FIGS. 4A and 4B.

It is noted that normal graphitic carbon also shows substantial peaks/rings at 0.334 nm due to the spacing between various stacked layers. Apparently this 3D layering is less prominently present or even completely absent in NCG: the absence of the associated ring in the diffractograms of FIG. 4B is proof that there is no stacking of carbon films on top of each other, as occurs in graphite.

It is noted that in "Diamond-like amorphous carbon", J. Robertson, Materials Science and Engineering R37, 129-281 (2002) [-5-], specifically at page 154, it is mentioned that the 0.334 nm ring is related to inter-layer scattering, and this is only seen if there is a clear layer ordering in a graphitic structure. Note that Roberson uses structure factor S(k)=(2π)/d, and therefore 1.9/Angstrom (19/nm) corresponds to 3.3 Angstrom (0.33 nm). From this it can be understood that the absence of this ring implies that no such ordering is present.

Figure 4A:
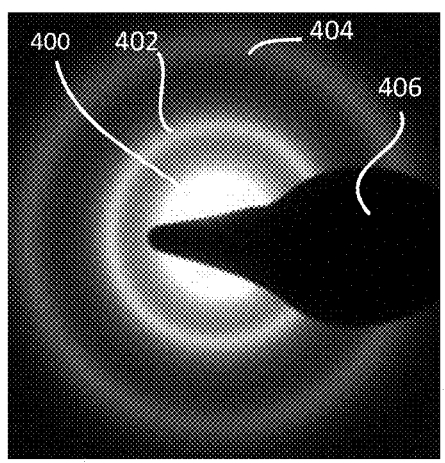
FIG. 4A shows the diffraction pattern of a thin film of amorphous carbon.

FIG. 4A shows the diffraction pattern of an amorphous thin film. There is a large central spot 400, representing the unscattered and slightly scattered electrons. A diffuse ring 402 represents electrons that are scattered at structures with a mutual distance of approximately 0.22 nm. Ring 402 is not sharply defined, indicating that there is a relative large variation on the mutual distance of these structures, as can be expected for amorphous material: there is no or little order. That the ring does not show points or arcs with larger intensity implies that there is no rotational preference of the scattering, another feature of amorphous material. Ring 404 represents the smaller lattice distance $d_2$ of approximately 0.122 nm. Object 406 is (the image of) the intercept needle blocking the central beam so as to avoid over-illumination and/or damage to the image sensor.

Figure 4B:
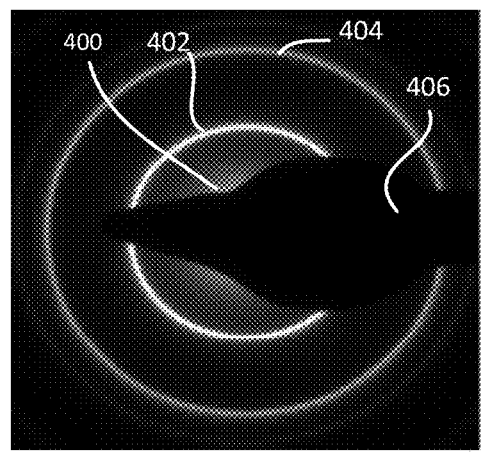
FIG. 4B shows the diffraction pattern of a treated thin film.

FIG. 4B shows the diffraction pattern of the thin film after treatment.

The rings are much better defined. Careful analysis of the diffraction pattern showed rings corresponding to lattice distances of 0.211 nm (100%), 0.122 nm (50%), 0.107 nm (7%), and peaks at 0.081, 0.071 and 0.062 nm (all at less than 5%).

Figure 5A:
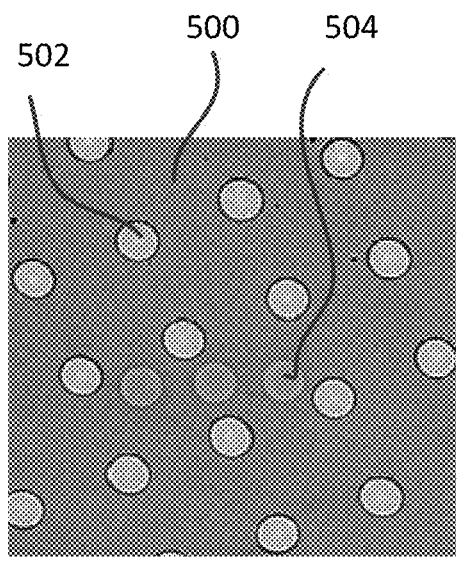
FIG. 5A shows an amorphous carbon film with "footprints.

FIG. 5A shows an amorphous carbon film with "footprints".

FIG. 5A shows an amorphous carbon film 500 with perforations 502. On the film a beam of electrons has impinged, resulting in "footprints" 504. These "footprints" are believed to result from a (temporary) change in electronic structure in the carbon film, and disappear in approximately 1 day.

Figure 5B:
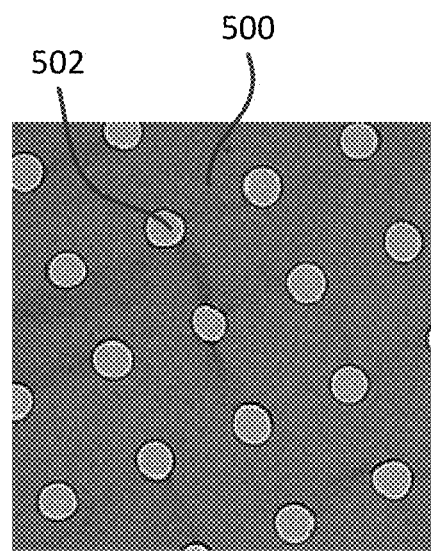
FIG. 5B shows a laser treated film where "footprints" are absent.

FIG. 5B shows a laser treated carbon film.

The film shown in FIG. 5B is in origin identical to the film shown in FIG. 5A, but this film is laser treated. No "footprints" are visible. However, the thermal treatment induced some mechanical deformation.

Compared to the diffraction pattern of FIG. 4A of amorphous carbon the rings and central spot are much better defined. The rings 402 and 404 do not show any granularity, proving that many crystals are present with a random orientation with respect to each other. Experiments showed that this is the case even for a beam diameter of 100 nm, even for a beam diameter as small as 100 nm.

Experiments were made in which an amorphous carbon film with a thickness of 20 nm was placed in the evacuated sample chamber of a Scanning Electron Microscope. Such a foil was first inspected in a TEM, and the diffraction pattern shown in FIG. 4A was thus recorded.

The foil was heated with a laser beam having a power of 10 mW and a wave length of 785 nm heating a spot with a diameter of between 25 μm to 100 μm. It is estimated that, at these conditions and film thickness, the foil absorbed 10% of this power, resulting in an absorbed power density of between 0.78 MW/m² (spot diameter 100 μm) and 12 MW/m² (spot diameter 25 μm). After heating the foil for several seconds, the laser beam was turned off and the foil was allowed to cool down in the sample chamber (the chamber at room temperature) to room temperature. Afterwards the condition of the foil was inspected in a TEM, and the diffraction pattern of FIG. 4B was recorded.

It is noted that preferably the film is cleaned before heating, as a film that is not heated is contaminated. A carbon contamination with carbon in another structure than amorphous carbon may results in a film with varying thickness, and it is suggested that a non-amorphous carbon film is also transformed into non-NCG carbon film. It is believed that a focused laser beam will also crack mobile contaminants on the film surface, causing a large build-up of some kind of amorphous carbon (but not of the type wanted), and also leading a large local change in thickness. It appears that heating to 250° C. (the temperature of the heating holder) is optimal. Heating is thus preferably performed by pre-heating in vacuum to a temperature of approximately 250° C.

It is noted that plasma cleaning is possible, but can easily change the thickness of the film through etching. This makes plasma cleaning a less preferred option for cleaning, but a candidate for fine-tuning the thickness of the thin film.

It is noted that during experiments a phase plate of NCG is used for an extended period of time at a temperature of slightly more than 500K (250° C.) without losing the nano-crystalline form taking place, or any other deterioration. Therefore it is believed that a cooling down (quenching) of the film from 2000K to 2500K to 1000K within 0.25 ms is sufficiently fast. This can be achieved by turning off the heating laser and allowing the film to cool down in an environment at room temperature, or slightly above (for example less than 500 K).

CITED NON-PATENT LITERATURE

[-1-] "Phase Contrast Enhancement with Phase Plates in Biological Electron Microscopy", K. Nagayama et al., Microscopy Today, Vol. 18 No. 4 (July 2010), pp. 10-13.
[-2-] Internet brochure http://www.emgrid.com.au/pdf/ACF-Metals-Products.pdf, created Aug. 14, 2007, Arizona Carbon Foil Co., Inc, Tucson, Ariz., USA more specifically paragraph 1, most specifically paragraph 1.1.
[-3-] Page of internet sales brochure http://www.agarscientific.com/ultra-smooth-carbon-foils.html, Agar Scientific, Stansted, Essex, CM24 8GF, United Kingdom.
[-4-] "Electron Vortex Beams with High Quanta of Orbital Angular Momentum", B. J. McMorran et al., Science 331, 192 (2011), pp. 192-195.
[-5-] "Diamond-like amorphous carbon", J. Robertson, Materials Science and Engineering R37, 129-281 (2002).

The invention claimed is:

1. A method of producing a freestanding thin film of nano-crystalline graphite, the method comprising the steps of: providing a freestanding thin film of amorphous carbon, locally heating the freestanding thin film to a high temperature in an inert atmosphere or in a vacuum, allowing the freestanding thin film to cool down; and as a result of which a freestanding thin film of nano-crystalline graphite is formed.

2. The method of claim 1 in which the local heating is performed by irradiating the freestanding thin film with a laser beam.

3. The method of claim 2 in which the wavelength of the laser, the power of the laser, the size of the irradiated area and the thickness of the thin film are such that the freestanding thin film absorbs locally between 0.1 MW/m$^2$ and 20 MW/m$^2$.

4. The method of claim 1 in which during local heating the temperature of the freestanding thin film rises locally to between 1000 K and 3700 K.

5. The method of claim 1 in which the freestanding thin film is locally heated for at least 1 second.

6. The method of claim 1 in which the freestanding thin film has a thickness of less than 1 μm.

7. The method of claim 1 in which the freestanding thin film is allowed to cool down in an environment of less than 500 K.

8. The method of claim 1 in which the freestanding thin film is allowed to cool down to a temperature below 1000 K in less than 1 ms.

9. The method of claim 1 in which the freestanding thin film is supported by a TEM grid.

10. The method of claim 1, the method further comprising the additional step of forming one or more holes in the film for passing beams of undiffracted or diffracted electrons, as a result of which a phase plate or phase mask for a transmission electron microscope is formed.

11. A phase plate for a transmission electron microscope, the phase plate comprising or made of a freestanding thin film of nano-crystalline graphite, wherein the freestanding thin film of nano-crystalline graphite comprises a multiplicity of layers.

12. A transmission electron microscope comprising the phase plate of claim 11.

13. The method of claim 10, wherein the one or more holes are formed by a method selected from the group of ion beam milling, gas-assisted electron beam etching, and laser beam irradiation.

14. The method of claim 1, wherein, after processing, the presence of a diffraction ring at 0.334 nm due to stacked layers, characteristic of normal graphitic carbon, is substantially reduced or eliminated.

15. The method of claim 1, wherein the film is cleaned before processing by pre-heating in a vacuum, preferably to a temperature of approximately 250° C.

16. The phase plate of claim 11, wherein the crystal size in the nano-crystalline graphite is less than 100 nm.

17. A method of observing a sample in a transmission electron microscope, the method comprising:
    forming a freestanding nano-crystalline graphite film in accordance with claim 1; and
    directing a portion of an electron beam through the nano-crystalline graphite film, the nano-crystalline graphite film shifting the phase of the portion of the electron beam, wherein the freestanding thin film of nano-crystalline graphite comprises a multiplicity of layers.

18. The method of claim 17, in which directing a portion of an electron beam through the nano-crystalline graphite film comprises directing a portion of an electron beam through the nano-crystalline graphite film in a diffraction plane of the transmission microscope, or an image of the diffraction plane.

19. A phase plate for a transmission electron microscope made in accordance with the method of claim 1, wherein the freestanding thin film of nano-crystalline graphite comprises a multiplicity of layers.

20. The phase plate of claim 11 further comprising one or more holes in the free stranding film of nano-crystalline graphite for passing beams of undiffracted electrons.

21. The phase plate of claim 19 wherein the freestanding thin film of nano-crystalline graphite has a thickness of between about 19.9 nm and 30.8 nm.

* * * * *